United States Patent
Wiciel

[11] Patent Number: 6,064,141
[45] Date of Patent: May 16, 2000

[54] PIEZOELECTRIC SWITCH

[75] Inventor: Richard D. Wiciel, Windham, N.H.

[73] Assignee: Piezo Switch Development Inc., Providence, R.I.

[21] Appl. No.: 09/108,942

[22] Filed: Jul. 1, 1998

Related U.S. Application Data

[60] Provisional application No. 60/051,376, Jul. 1, 1997, provisional application No. 60/051,455, Jul. 1, 1997, provisional application No. 60/051,469, Jul. 1, 1997, and provisional application No. 60/059,627, Sep. 23, 1997.

[51] Int. Cl.$^7$ .................................................. H01L 41/08
[52] U.S. Cl. ........................ 310/339; 310/324; 310/348; 310/351
[58] Field of Search .................................. 310/324, 339, 310/348, 351

[56] References Cited

U.S. PATENT DOCUMENTS

| | | | |
|---|---|---|---|
| 4,158,117 | 6/1979 | Quilliam et al. | 200/181 |
| 4,430,595 | 2/1984 | Nakasone et al. | 310/339 |
| 4,527,105 | 7/1985 | Shiraishi | 318/444 |
| 4,581,506 | 4/1986 | Bai et al. | 310/339 |
| 4,618,797 | 10/1986 | Cline | 310/339 |
| 4,761,582 | 8/1988 | McKee | 310/322 |
| 4,896,069 | 1/1990 | Rosenberg et al. | 310/339 |
| 5,231,326 | 7/1993 | Echols | 310/339 |
| 5,266,863 | 11/1993 | Nonami et al. | 310/339 |
| 5,332,944 | 7/1994 | Cline | 310/339 |
| 5,442,150 | 8/1995 | Ipcinski | 200/181 |
| 5,636,729 | 6/1997 | Wiciel | 200/181 |
| 5,982,304 | 11/1999 | Selker et al. | 310/339 |
| 6,003,390 | 12/1999 | Cousy | 310/339 |

*Primary Examiner*—Thomas M. Dougherty
*Attorney, Agent, or Firm*—Kriegsman & Kriegsman

[57] ABSTRACT

A piezoelectric switch comprises a housing having an inner surface and an outer surface. A piezoelectric element is mounted on the inner surface of the housing. The piezoelectric element has a top layer made of piezo crystal and a bottom layer made of a conductive metal such as brass. A printed circuit board is disposed within the housing for controlling the state of the switch. The printed circuit board is electrically connected to the piezoelectric element by an electrical conductor. In one embodiment, the electrical conductor is in the form of a flex circuit which has a positive terminal, a negative terminal and a printed circuit board overlay portion that is affixed to the printed circuit board. The flex circuit sandwiches the piezoelectric element therewithin so that the positive terminal contacts the top layer and the negative terminal contacts the bottom layer. In another embodiment, the piezoelectric switch additionally comprises a pushbutton assembly movably mounted on the housing for providing the operator of the switch with a noticeable indication of a change in the state of the switch.

19 Claims, 4 Drawing Sheets

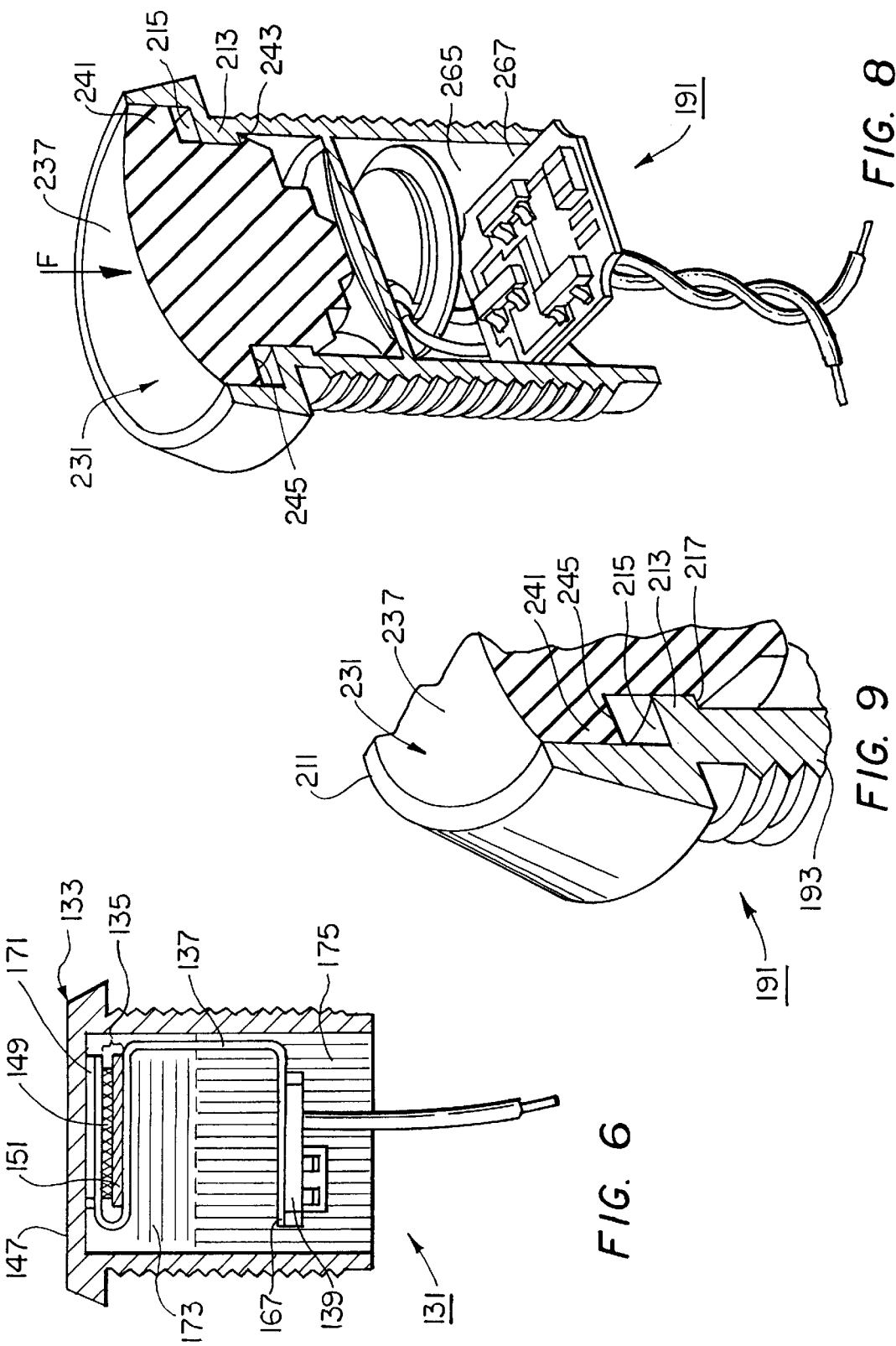

PIEZOELECTRIC SWITCH

CROSS-REFERENCE TO RELATED APPLICATIONS

This application claims the benefit of U.S. Provisional Application No. 60/051,376, filed on Jul. 1, 1997, U.S. Provisional Application No. 60/051,455, filed on Jul. 1, 1997, U.S. Provisional Application No. 60/051,469, filed on Jul. 1, 1997, and U.S. Provisional Application No. 60/059,627, filed on Sep. 23, 1997.

BACKGROUND OF THE INVENTION

The present invention relates generally to electrical switches and more particularly to piezoelectric switches.

Piezoelectric switches, also commonly referred to simply as piezo switches, are well known devices. Piezoelectric switches typically comprise a piezo crystal transducer, or piezo element, which is electrically connected to an electronic circuit board by a conductor, such as a pair of wires. The piezo crystal transducer, electronic circuit board and conductor are typically held within a plastic housing. The piezo crystal transducer is typically mounted within the plastic housing so that an input of physical contact onto the housing, in turn, produces an input of physical contact onto the piezo crystal transducer.

In use, the input of physical contact, such as by tactile pressure, onto the housing of the piezoelectric switch, in turn, produces an input of physical contact onto the piezo crystal transducer. The input of physical contact onto the piezo crystal transducer causes the piezo crystal transducer to produce an electrical output that passes onto the electronic circuit board which, in turn, effects the state of connection of the piezoelectric switch.

In U.S. Pat. No. 4,430,595 to H. Nakasone et al, there is disclosed a piezo-electric push button switch. In the piezo-electric push button switch, a flexible printed circuit board is secured to terminals which are embedded in the housing, and the piezo-electric plate is supported by the flexible printed circuit board in such a manner that it is floated from the housing, whereby external impact or vibration is decreased, and in which an integrated circuit consisting of a resistor and a capacitor is incorporated in the switch body, to eliminate harmonics.

Piezoelectric switches are more desirable than conventional mechanical switches because piezoelectric switches have no moving parts. To the contrary, conventional mechanical switches have mechanical contacts which depend upon significant freedom of motion of at least one component for enabling the switch to function properly. Accordingly, it should be known that utilizing a piezoelectric switch, which has no moving parts, introduces numerous advantages.

As a first advantage, because a piezoelectric switch has no moving parts, the switch is less likely to become damaged from use, thereby making the switch more reliable over time.

As a second advantage, because a piezoelectric switch has no moving parts, the switch can be filled with a potting compound, such as a silicon gel, in order to make the switch hermetically sealed against environmental changes which can either actuate the switch, such as by a change in temperature, or which can corrode the switch, such as by the introduction of moisture into the switch.

For example, in U.S. Pat. No. 4,618,797 to D. J. Cline, there is disclosed an environmentally sealed sensing assembly for an electrical switch for use in adverse conditions such as a warm and humid location. The sensing assembly comprises a piezoelectric element carried by a relatively thin, flexible member supported at its edges within a recess formed in an enclosure. The enclosure includes a cavity in communication with the recess through a flow passage. A resiliently deformable encapsulating or potting material fills the recess, cavity, flow passage and any voids adjacent the piezoelectric element and the flexible member. Flexure of the flexible member through manual pressure or the like, to deform the piezoelectric element, is permitted by resilient deformation or "flow" of the potting compound. The potting material thus provides sealing while yet allowing mechanical movement of the flexible member and associated piezoelectric element. The resulting electrical signal caused by deformation of the piezoelectric element can be conditioned and used for switching electrical devices.

Environmentally sealed piezoelectric switches of the type described in Cline have been found to experience some notable drawbacks.

As a first drawback, it has been found that soldering a pair of conductive wires onto the piezoelectric element can be a difficult task because of the relatively small surface area of the piezoelectric crystal. Specifically, piezoelectric elements used in piezoelectric switches typically comprise a top layer which is formed entirely of piezo crystal and a slightly larger bottom layer which is formed entirely of brass. Accordingly, because the bottom layer of brass is often larger in size than the top layer of piezo crystal, a conductive wire must be soldered onto the top surface of each layer of the piezoelectric element. As such, it has often been found that this means of connection can cause considerable interference of the wires against the housing of the switch, which is undesirable.

As a second drawback, it has been found that the user is often unable to determine the state of the piezoelectric switch. Specifically, due to the lack of moving parts in piezoelectric switches, the user is often unaware of whether the state of the switch has been changed upon the input of pressure onto the housing.

As a result, in U.S. Pat. No. 5,636,729 to R. Wiciel, there is disclosed a piezo-electric switch having a lighted push-button. The piezo switch has a case for mounting the push-button, a piezo element with a hole in it, and a hollow spacer for separating the push-button from the piezo element; the holes in the spacer and piezo element are aligned with each other. Within the case is mounted a light source, where the light source may be positioned within the hole in the spacer, or in the hole in the piezo element, but in either configuration allowing light to shine through the holes to illuminate the push-button.

Although well-known and widely used in commerce, the piezoelectric switch disclosed in Wiciel includes additional components, such as a light source, which can significantly increase the overall cost of the switch.

SUMMARY OF THE INVENTION

It is an object of the present invention to provide a switch which has no moving parts.

It is another object of the present invention to provide a new and improved piezoelectric switch.

It is yet another object of the present invention to provide a piezoelectric switch which is relatively small in size.

It is still another object of the present invention to provide a piezoelectric switch which is not susceptible to the input of thermal influences.

It is yet still another object of the present invention to provide a piezoelectric switch which has a minimum number of parts, is simple in construction and is easy to use.

Accordingly, in one embodiment of the present invention, there provided a piezoelectric switch comprising a housing having an inner surface, an outer surface and a closed top end accessible to a tactile input, a piezoelectric element having a top layer made of a conductive metal and a bottom layer made of piezo crystal, said piezoelectric element being disposed within said housing such that the top layer is affixed to the inner surface of the closed top end, said piezoelectric element being characterized by generating an electrical signal upon deformation, a printed circuit board disposed within said housing, and an electrical conductor coupled to said piezoelectric element and said printed circuit board.

In another embodiment of the present invention, there is provided a piezoelectric switch comprising a housing having an inner surface, an outer surface and a closed top end accessible to a tactile input, a piezoelectric element having a top layer made of piezo crystal and a bottom layer made of a conductive metal, said piezoelectric element being characterized by generating of an electrical signal upon deformation, a printed circuit board disposed within said housing, and a flex circuit having a positive terminal, a negative terminal and a printed circuit board overlay portion, said flex circuit sandwiching said piezoelectric element therewithin so that the positive terminal contacts the top layer and the negative terminal contacts the bottom layer, the printed circuit board overlay portion being affixed to said printed circuit board, said flex circuit being disposed within said housing so that the positive terminal is affixed to the inner surface of the closed top end.

In another embodiment of the present invention, there is provided a piezoelectric switch comprising a housing having an inner surface, an outer surface and a thin, central member which separates the interior of said housing into a top enclosure area and a bottom enclosure area, the central member having a flat top surface and a flat bottom surface, a pushbutton assembly movably mounted within the top enclosure area of said housing, a piezoelectric element having a top layer made of piezo crystal and a bottom layer made of a conductive metal, said piezoelectric element being disposed within said housing such that the top layer is affixed to the flat bottom surface of the central member of said housing, said piezoelectric element being characterized by generating of an electrical signal upon deformation, a printed circuit board disposed within said housing, and an electrical conductor coupled to said piezoelectric element and said printed circuit board.

Various other features and advantages will appear from the description to follow. In the description, reference is made to the accompanying drawings which form a part thereof, and in which is shown by way of illustration, various embodiments for practicing the invention. These embodiments will be described in sufficient detail to enable those skilled in the art to practice the invention, and it is to be understood that other embodiments may be utilized and that structural changes may be made without departing from the scope of the invention. The following detailed description is therefore, not to be taken in a limiting sense, and the scope of the present invention is best defined by the appended claims.

BRIEF DESCRIPTION OF THE DRAWINGS

In the drawings wherein like reference numerals represent like parts:

FIG. 6 is a front section view of the piezoelectric switch shown in FIG. 5;

FIG. 8 is a front section view of the piezoelectric switch shown in FIG. 7; and

FIG. 9 is an enlarged section view, broken away in part, of the piezoelectric switch shown in FIG. 7.

DETAILED DESCRIPTION OF THE PREFERRED EMBODIMENT

Figure 1:
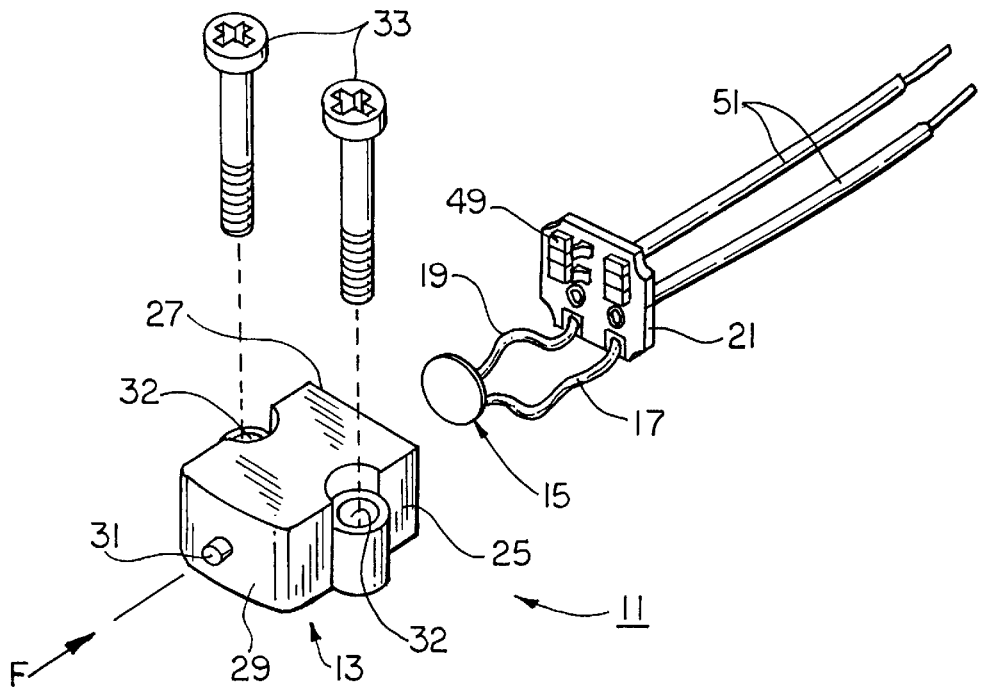
FIG. 1 is a partially exploded perspective view of a first embodiment of a piezoelectric switch constructed according to the teachings of the present invention.
Figure 2:
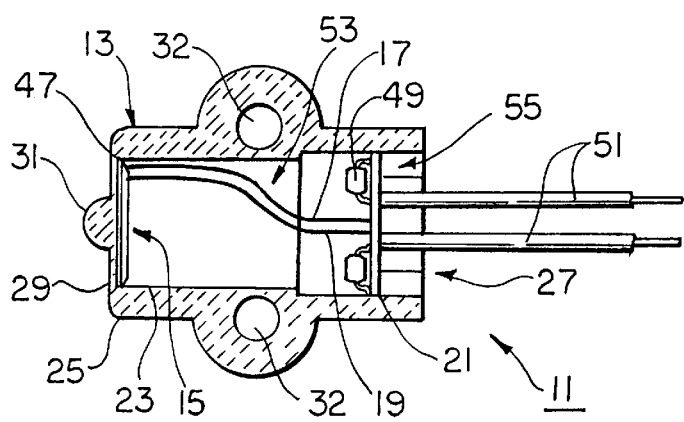
FIG. 2 is a front section view of the piezoelectric switch shown in FIG. 1.

Referring now to FIGS. 1 and 2, there is shown a first embodiment of a piezoelectric switch constructed according to the teachings of the present invention, the piezoelectric switch being identified by reference numeral 11.

Piezoelectric switch 11 comprises a housing 13, a piezoelectric element 15, a pair of conductive wires 17 and 19 and a printed circuit board 21.

Housing 13 is a hollowed-out, generally rectangularly-shaped enclosure which comprises an inner surface 23, an outer surface 25, an open bottom end 27 and a closed top end 29. Closed top end 29 includes an actuation button 31 integrally formed on outer surface 25. Housing 13 is constructed of a rigid and insulating material, such as plastic or metal. Housing 13 further comprises a pair of mounting holes 32 through which a pair of screws 33 can be disposed in order to enable switch 11 to be fixedly mounted onto a mounting surface.

Figure 3:
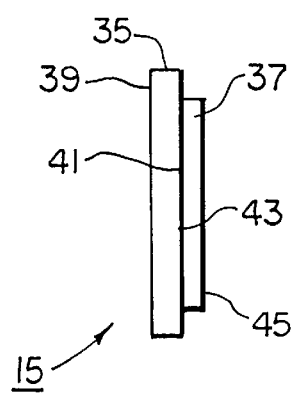
FIG. 3 is an enlarged, front view of the piezoelectric element shown in FIG. 2.

Referring now to FIG. 3, piezoelectric element 15 comprises a disc-shaped top layer 35 and a disc-shaped bottom layer 37, bottom layer 37 being slightly smaller in size than top layer 35. Disc-shaped top layer 35 is made of a conductive metal, such as brass, and serves as the negative terminal for switch 11, disc-shaped top layer 35 comprising a top surface 39 and a bottom surface 41. Disc-shaped bottom layer 37 is made of piezo crystal and serves as the positive terminal for switch 11, disc-shaped bottom layer 37 comprising a top surface 43 and a bottom surface 45. Bottom surface 41 of top layer 35 is permanently affixed to top surface 43 of bottom layer 37 by an adhesive (not shown) to make piezoelectric element 15 a unitary member.

It should be noted that bottom layer 37 of piezoelectric element 15 is relatively small in size and could be manufactured by stamping or punching a small disc-shaped portion out of a piece of piezo crystal. Because the size of bottom layer 37 is relatively small, switch 11 is very inexpensive to manufacture.

Piezoelectric element 15 is fixedly mounted onto housing 13. Specifically, top surface 39 of top layer 35 of element 15 is affixed to inner surface 23 of closed top end 29 of housing 13 by an adhesive 47. Adhesive 47 is a pressure sensitive adhesive which has a thickness of approximately 0.04 inches so as to space top layer 35 of element 15 slightly away from closed top end 29 of housing 13.

Pair of conductive wires 17 and 19 electrically connect piezoelectric element 15 to printed circuit board 21, printed circuit board 21 being disposed within housing 13. One end of conductive wire 17 is soldered to bottom surface 41 of top layer 35 and the other end of conductive wire 17 is soldered to printed circuit board 21. One end of conductive wire 19 is soldered to bottom surface 45 of bottom layer 37 and the other end of conductive wire 17 is soldered to printed circuit board 21.

Electronics 49 are soldered onto printed circuit board 21 and serve to effect the state of switch 11. A pair of wires 51 are also soldered onto printed circuit board 21 and serve to connect switch 11 to a switch connection (not shown).

As shown in FIG. 2, piezoelectric switch 11 further comprises a layer of potting compound 53, such as silicon, for environmentally sealing element 15 and a portion of wires 17 and 19 within housing 13. Layer of potting compound 53 permits enough flexure of piezoelectric element 15 to generate a switching output signal in response to external pressure applied to housing 13 by an operator. Piezoelectric switch 11 also comprises a layer of hard epoxy 55 for fixedly securing printed circuit board 21 within housing 13.

In use, switch 11 is designed to function in the following manner. The input of physical contact, as represented by arrow F in FIG. 1, onto the actuation button 31 of housing 13, in turn, produces an input of physical contact against piezoelectric element 15. The input of physical contact onto piezoelectric element 15 causes element 15 to produce an electrical output which passes through conductive wires 17 and 19 and onto printed circuit board 21 which, in turn, effects the state of connection of switch 11.

As can be appreciated, due to the limited number and relatively small size of its component parts, switch 11 is relatively small in size and inexpensive to manufacture. However, due to the close proximity of conductive top layer 35 of element 15 to closed top end 29 of housing 13, switch 11 is susceptible to thermal influences, which can be undesirable in certain applications.

Figure 4:
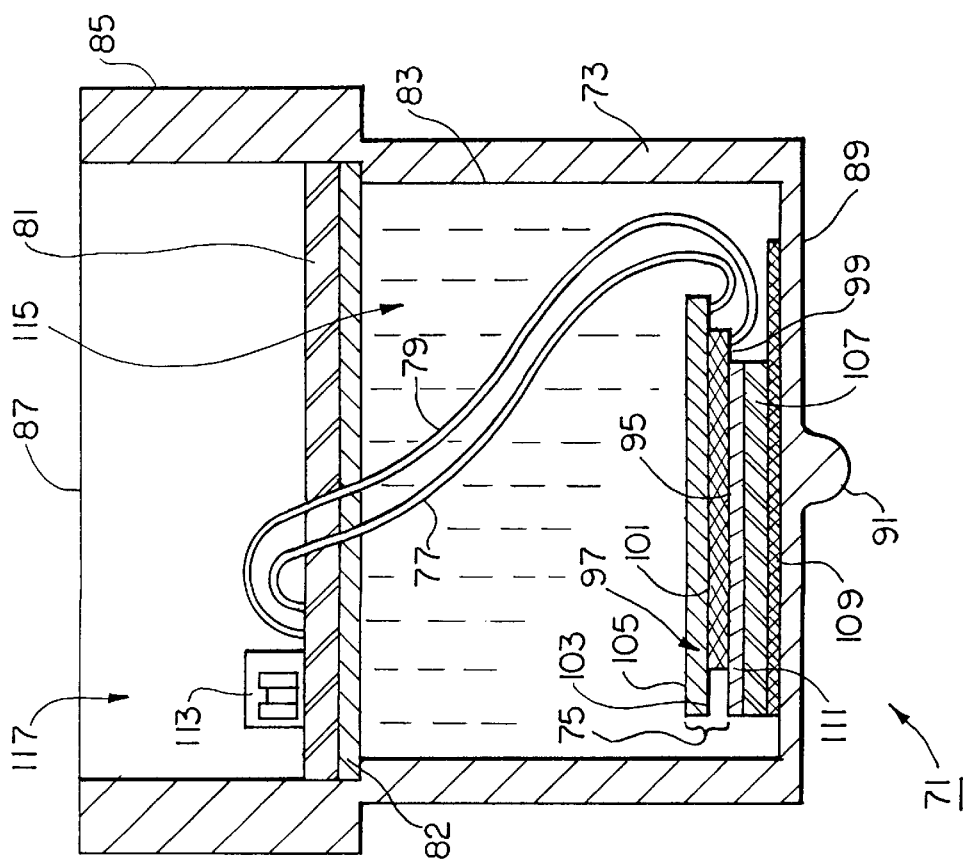
FIG. 4 is an enlarged, front section view of a second embodiment of a piezoelectric switch constructed according to the teachings of the present invention.

Accordingly, as shown in FIG. 4, there is shown a second embodiment of a piezoelectric switch constructed according to the teachings of the present invention, the piezoelectric switch being identified by reference numeral 71. As will be discussed in detail below, piezoelectric switch 71 is designed to be less susceptible to thermal influences than piezoelectric switch 11.

Piezoelectric switch 71 comprises a housing 73, a piezoelectric element 75, a pair of conductive wires 77 and 79 and a printed circuit board 81.

Housing 73 is similar to housing 13 of switch 11. Housing 73 is a hollowed-out, generally rectangularly-shaped enclosure which comprises an inner surface 83, an outer surface 85, an open bottom end 87 and a closed top end 89. Closed top end 89 includes an actuation button 91 integrally formed on outer surface 89. Housing 73 is constructed of a rigid and insulating material, such as plastic or metal.

Piezoelectric element 75 comprises a disc-shaped top layer 95 and a disc-shaped bottom layer 97, bottom layer 97 being slightly larger in size than top layer 95. Disc-shaped top layer 95 is made of a piezo crystal and serves as the positive terminal for switch 71, disc-shaped top layer 95 comprising a top surface 99 and a bottom surface 101. Disc-shaped bottom layer 97 is made of a conductive metal, such as brass, and serves as the negative terminal for switch 71, disc-shaped bottom layer 97 comprising a top surface 103 and a bottom surface 105. Bottom surface 101 of top layer 95 is permanently affixed to top surface 103 of bottom layer 97 by an adhesive (not shown) to make piezoelectric element 75 a unitary member.

It should be noted that piezoelectric element 75 is constructed to be less susceptible to thermal influences than piezoelectric element 15 of switch 11. Specifically, top layer 95 of element 75 is made of piezo crystal and bottom layer 97 of element 75 is made of brass. Because conductive bottom layer 97 of element 75 is spaced away from closed top end 89 of housing 73 by top layer 95, piezoelectric switch 71 is less susceptible to thermal influences.

Piezoelectric switch 71 also comprises a non-conductive spacer element 107 for further spacing piezoelectric element 75 away from closed top end 89 of housing 73, thereby making switch 71 less susceptible to thermal influences. Spacer element 107 is preferably a disc-shaped plastic spacer having a thickness of approximately 0.025 inches and is disposed between piezoelectric element 75 and housing 73. A first layer of pressure sensitive adhesive 109 is disposed between spacer element 107 and housing 73 and a second layer of pressure sensitive adhesive 111 is disposed between spacer element 107 and piezoelectric element 75.

It should be noted that spacer element 107 is not limited to being a disc-shaped plastic spacer having a thickness of approximately 0.025 inches. Rather, spacer element 107 could be manufactured in alternative shapes and sizes. For example, spacer element 107 could be manufactured in the form an elongated cylindrical member without departing from the spirit of the present invention. Also, it should be noted that spacer element 107 could be integrally formed onto closed top end 89 of housing 73 without departing from the spirit of the present invention.

Pair of conductive wires 77 and 79 electrically connect piezoelectric element 75 to printed circuit board 81, printed circuit board 81 being disposed within housing 13 beneath a nomex spacer element 82. One end of conductive wire 77 is soldered to top surface 103 of bottom layer 97 and the other end of conductive wire 77 is soldered to printed circuit board 81. One end of conductive wire 79 is soldered to top surface 99 of top layer 95 and the other end of conductive wire 79 is soldered to printed circuit board 81. Electronics 113 are soldered onto printed circuit board 81 and serve to effect the state of switch 71.

Piezoelectric switch 71 further comprises a layer of potting compound 115, such as a soft epoxy silicon 60 durometer shore A, for environmentally sealing element 75, spacer element 107 and a portion of wires 77 and 79 within housing 73. Layer of potting compound 115 permits enough flexure of piezoelectric element 75 to generate a switching output signal in response to external pressure applied to housing 73 by an operator. Piezoelectric switch 11 also comprises a layer of hard epoxy 117 for fixedly securing printed circuit board 81 within housing 73.

In use, switch 71 is designed to function in the following manner. The input of physical contact onto the actuation button 91 of housing 73, in turn, produces an input of physical contact onto spacer element 107 and, in turn, against piezoelectric element 75. The input of physical contact onto piezoelectric element 75 causes element 75 to produce an electrical output which passes through conductive wires 77 and 79 and onto printed circuit board 81 which, in turn, effects the state of connection of switch 11.

Although piezoelectric switch 71 is environmentally sealed, switch 71 has one notable drawback. Specifically, it has been found that soldering conductive wires 77 and 79 onto piezoelectric element 75 can be a difficult task because of the relatively small surface area of element 75. In particular, because bottom layer 97 is larger in size than top layer 95, conductive wire 79 must be soldered to top surface 99 of top layer 95 of piezoelectric element 75. As such, it has been found that the connection of conductive wire 79 to top layer 95 can cause conductive wire 79 to interfere against housing 73 of switch 71, which is undesirable.

Figure 5:
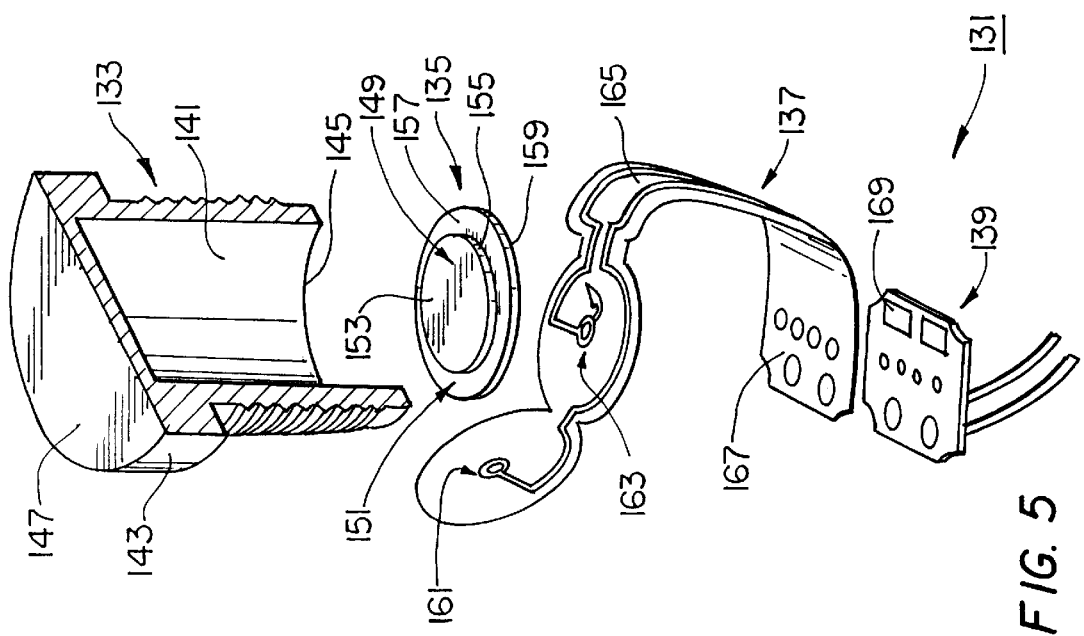
FIG. 5 is a partially exploded perspective view of a third embodiment of a piezoelectric switch constructed according to the teachings of the present invention, the flex conductor being shown with its terminals open so as not to contact the piezoelectric element.

Accordingly, as shown in FIGS. 5 and 6, there is shown a third embodiment of a piezoelectric switch constructed according to the teachings of the present invention, the piezoelectric switch being identified by reference numeral 131.

Piezoelectric switch 131 comprises a housing 133, a piezoelectric element 135, a flex circuit 137 and a printed circuit board 139.

Housing 133 is a hollowed-out, generally cylindrically-shaped enclosure which comprises an inner surface 141, an outer surface 143, an open bottom end 145 and a closed top end 147. Housing 133 is constructed of a rigid and insulating material, such as plastic or metal.

It should be noted that piezoelectric switch 131 is not limited to the particular size and shape of housing 133. Rather, housing 133 could be replaced with an alternative housing without departing from the scope of the present invention. For example, housing 133 could be replaced with housing 13 of switch 11 without departing from the scope of the present invention.

Piezoelectric element 135 comprises a disc-shaped top layer 149 and a disc-shaped bottom layer 151, bottom layer 151 being slightly larger in size than top layer 149. Disc-shaped top layer 149 is made of piezo crystal and serves as the positive terminal for switch 131, disc-shaped top layer 149 comprising a top surface 153 and a bottom surface 155. Disc-shaped bottom layer 151 is made of a conductive metal, such as brass, and serves as the negative terminal for switch 131, disc-shaped bottom layer 151 comprising a top surface 157 and a bottom surface 159. Bottom surface 155 of top layer 149 is permanently affixed to top surface 157 of bottom layer 151 by an adhesive (not shown) to make piezoelectric element 135 a unitary member.

It should be noted that piezoelectric element 135 is constructed to be less susceptible to thermal influences than piezoelectric element 15 of switch 11. Specifically, top layer 149 of element 135 is made of piezo crystal and bottom layer 151 of element 135 is made of brass. Because conductive bottom layer 151 of element 135 is spaced away from closed top end 147 of housing 133 by top layer 149 as well as by flex circuit 137, as will be described below, piezoelectric switch 131 is less susceptible to thermal influences.

Flex circuit 137, also commonly referred to as a flex conductor, comprises a circularly-shaped positive terminal 161, a circularly-shaped negative terminal 163, a connective member 165 and a printed circuit board overlay portion 167. Flex circuit 137 can be folded so as to sandwich piezoelectric element 135 therewithin, with positive terminal 161 contacting top surface 153 of top layer 149 and negative terminal 163 contacting bottom surface 159 of bottom layer 15. An adhesive (not shown) can be applied to positive terminal 161 and negative terminal 163 to fixedly secure piezoelectric element 135 within flex circuit 137.

As can be appreciated, the use of flex circuit 137 in piezoelectric switch 131, as opposed to soldered conductive wires, greatly simplifies the ease in manufacturing switch 131 and enables the size of piezoelectric element 135 to be greatly decreased, thereby decreasing the overall cost for switch 131.

Printed circuit board overlay portion 167 of flex circuit 137 is permanently affixed onto printed circuit board 139 by a conductive adhesive (not shown). As such, flex circuit 137 electrically connects piezoelectric element 135 to printed circuit board 139 and, in particular, to electronics 169 soldered to printed circuit board 139 for effecting the state of switch 131.

As shown in FIG. 6, positive terminal 161 of flex circuit 137 is permanently affixed to inner surface 141 of housing 133 at closed top end 147 by a layer of a pressure sensitive adhesive 171. As noted above, flex circuit 137 is affixed housing 133 such that bottom layer 151, which is made of brass, is disposed away from closed top end 147, thereby making switch 131 less susceptible to thermal influences.

Piezoelectric switch 131 further comprises a layer of potting compound 173, such as a soft epoxy silicon 60 durometer shore A, for environmentally sealing piezoelectric element 135 and a portion of flex circuit 137 within housing 73. Layer of potting compound 173 permits enough flexure of piezoelectric element 135 to generate a switching output signal in response to external pressure applied to closed top end 147 of housing 73 by an operator. Piezoelectric switch 131 also comprises a layer of hard epoxy 175 for fixedly securing printed circuit board 167 and a portion of flex circuit 137 within housing 133.

In use, switch 131 is designed to function in the following manner. The input of physical contact onto the closed top end 147 of housing 133, in turn, produces an input of physical contact onto piezoelectric element 135. The input of physical contact onto piezoelectric element 135 causes element 135 to produce an electrical output which passes through flex circuit 137 and to printed circuit board 139 which, in turn, effects the state of connection of switch 131.

Although piezoelectric switch 131 is environmentally sealed and easy to manufacture, switch 131 has one notable drawback. Specifically, it has been found that the lack of moving parts in switch 131 makes it difficult for the operator to ascertain whether the input of force onto housing 133 was sufficient to effect the state of switch 131.

Figure 7:
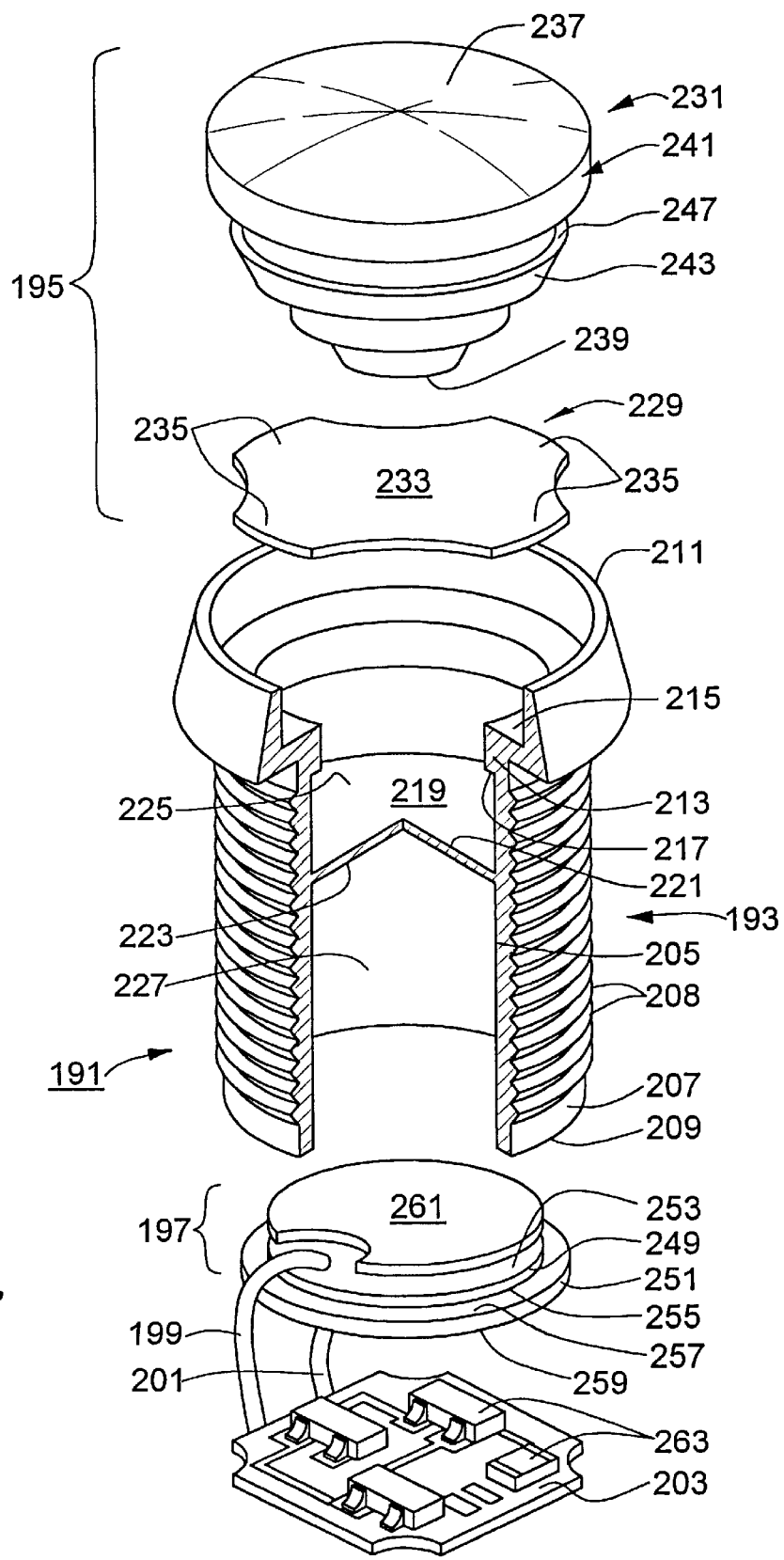
FIG. 7 is a partially exploded perspective view of a fourth embodiment of a piezoelectric switch constructed according to the teachings of the present invention.

Accordingly, as shown in FIGS. 7 and 8, there is shown a fourth embodiment of a piezoelectric switch constructed according to the teachings of the present invention, the piezoelectric switch being identified by reference numeral 191. As will be discussed in detail below, piezoelectric switch 191 includes a pushbutton mechanism which provides the operator with a noticeable indication of a change in the state of switch 191.

Piezoelectric switch 191 comprises a housing 193, a pushbutton assembly 195, a piezoelectric element 197, a pair of conductive wires 199 and 201 and a printed circuit board 203.

Housing 193 is a hollowed-out, generally cylindrically-shaped enclosure which comprises an inner surface 205, an outer surface 207, an open bottom end 209 and open top end 211. Housing 193 is constructed of a rigid and insulating material, such as plastic or metal. Outer surface 207 of housing 193 includes a threaded portion 208 for enabling piezoelectric switch 191 to be screwed into a particular mounting surface (not shown).

Housing 193 also comprises a flange 213 which is integrally formed thereto at a location slightly beneath open top end 211. Flange 213 comprises a flat top surface 215 and a flat bottom surface 217.

Housing 193 further comprises an thin, disc-shaped central member 219 which is integrally formed onto inner surface 205 at the approximate midpoint between open top end 211 and open bottom end 209. Interior disc-shaped member 219 comprises a flat, top surface 221 and a flat, bottom surface 223. As shown in FIG. 7, interior disc-shaped member 219 separates the interior of housing 193 into two sections, namely, a top enclosure area 225 and a bottom enclosure area 227.

Pushbutton assembly 195 is disposed within top enclosure area 225 of housing 193 and comprises a dome spring 229 and a pushbutton 231.

Dome spring 229 is a generally X-shaped, curved metal plate having a center portion 233 and four outer end points 235. Dome spring 229 is disposed within top enclosure area 225 so that end points 235 contact against top surface 221 of member 219. Dome spring 229 is naturally biased in a convex position so that center portion 233 is disposed slightly above top surface 221 of member 219. As will be discussed in detail below, center portion 233 only contacts top surface 221 of member 219 upon the application of a downward force onto center portion 233.

Pushbutton 231 is a unitary plastic member which comprises an enlarged top surface 237 and a narrow bottom surface 239. Pushbutton 231 also comprises a top lip 241 and an intermediate lip 243, top lip 241 having a bottom surface 245 and intermediate lip 243 having a top surface 247.

Pushbutton 231 is snap-fit within top enclosure area 225 of housing 193, with narrow bottom surface 239 in contact with center portion 233 of dome spring 229. Absent the application of force onto pushbutton 231, dome spring 229 is naturally biased so that center portion 233 is displaced slightly above top surface 221 of member 219, center portion 233, in turn, moving pushbutton 231 upwards so that top surface 247 of intermediate lip 243 abuts against bottom surface 217 of flange 213, as shown in FIGS. 8 and 9. Upon the application of downward force F', as shown in FIG. 8, down onto pushbutton 231, bottom surface 239 of pushbutton 231 compresses dome spring 229 so that center portion 233 contacts top surface 221 of member 219, with pushbutton 231 moving downward until bottom surface 245 of top lip 241 abuts against top surface 215 of flange 213.

It should be noted that pushbutton assembly 195 provides the operator of switch 191 with tactile and audible indications of a change in the state of switch 191. Specifically, the downward movement of pushbutton 231 provides the operator with a tactile feedback that most piezoelectric switches lack. In addition, the downward movement of pushbutton 231 compresses dome spring 229 which, in turn, creates an audible clicking sound, thereby further notifying the operator of a change in the state of switch 191.

Piezoelectric element 197 is disposed within bottom enclosure area 227 of housing 193 and comprises a disc-shaped top layer 249 and a disc-shaped bottom layer 251, bottom layer 251 being slightly larger in size than top layer 249. Disc-shaped top layer 249 is made of a piezo crystal and serves as the positive terminal for switch 191, disc-shaped top layer 249 having a top surface 253 and a bottom surface 255. Disc-shaped bottom layer 251 is made of a conductive metal, such as brass, and serves as the negative terminal for switch 191, disc-shaped bottom layer 251 comprising a top surface 257 and a bottom surface 259. Bottom surface 255 of top layer 249 is permanently affixed to top surface 257 of bottom layer 251 by an adhesive (not shown) to make piezoelectric element 197 a unitary member.

Piezoelectric switch 191 also comprises a non-conductive disc-shaped plastic spacer element 261 having a thickness of approximately 0.04 inches. Spacer element 261 has pressure sensitive adhesive on both sides and is disposed so that one side of element 261 is in contact with top surface 253 of piezoelectric element 197 and the other side of element 261 is in contact with flat, bottom surface 223 of interior disc-shaped member 219 of housing 193.

Pair of conductive wires 199 and 201 electrically connect piezoelectric element 197 to printed circuit board 203, printed circuit board 81 being disposed within bottom enclosure area 227 of housing 193. One end of conductive wire 199 is soldered to top surface 253 of top layer 249 and the other end of conductive wire 199 is soldered to printed circuit board 203. One end of conductive wire 201 is soldered to bottom surface 259 of bottom layer 251 and the other end of conductive wire 201 is soldered to printed circuit board 203. Electronics 263 are soldered onto printed circuit board 203 and serve to effect the state of switch 191.

Piezoelectric switch 191 further comprises a layer of potting compound 265, such as a soft epoxy silicon 60 durometer shore A, for environmentally sealing element 197, spacer element 261 and a portion of wires 199 and 201 within bottom enclosure area 227 of housing 193. Layer of potting compound 265 permits enough flexure of piezoelectric element 197 to generate a switching output signal in response to external pressure applied to pushbutton 231 by an operator. Piezoelectric switch 191 also comprises a layer of hard epoxy 267 for fixedly securing printed circuit board 203 within bottom enclosure area 227 of housing 193.

In use, switch 191 is designed to function in the following manner. The input of force F', as shown in FIG. 8, down onto enlarged top surface 237 of pushbutton 231 causes narrow bottom surface 239 of pushbutton 231 to compress dome spring 229 so that center portion 233 contacts top surface 221 of member 219. The application of pressure onto member 219 produces an input of physical contact onto spacer element 261 and, in turn, against piezoelectric element 197. The input of physical contact onto piezoelectric element 197 causes element 197 to produce an electrical output which passes through conductive wires 199 and 201 and onto printed circuit board 203 which, in turn, effects the state of connection of switch 191.

It should be known that although piezoelectric switch 191 is shown using pair of wires 199 and 201 to electrically connect piezoelectric element 197 to printed circuit board 203, piezoelectric switch could alternatively use a flex circuit, of the type described above in conjunction with switch 131, to electrically connect piezoelectric element 197 to printed circuit board 203 without departing from the spirit of the present invention.

The embodiments shown in the present invention are intended to be merely exemplary and those skilled in the art shall be able to make numerous variations and modifications to it without departing from the spirit of the present invention. All such variations and modifications are intended to be within the scope of the present invention as defined in the appended claims.

What is claimed is:

1. A piezoelectric switch comprising:
   (a). a housing having an inner surface, an outer surface and a closed top end accessible to a tactile input;
   (b). a piezoelectric element having a top layer made of a conductive metal and a bottom layer made of piezo crystal, said piezoelectric element being disposed within said housing such that the top layer is coupled directly to the inner surface of the closed top end, said piezoelectric element being characterized by generating an electrical signal upon deformation;

(c). a printed circuit board disposed within said housing; and (d). an electrical conductor coupled to said piezoelectric element and said printed circuit board.

2. The piezoelectric switch of claim 1 further comprising a layer of potting compound disposed within said housing, said layer of potting compound being resiliently deformable so as to enable flexure of said piezoelectric element for generating the electrical signal.

3. The piezoelectric switch of claim 2 wherein said potting compound is silicon.

4. The piezoelectric switch of claim 3 wherein the top layer of said piezoelectric element is made of brass.

5. The piezoelectric switch of claim 4 wherein the top layer of said piezoelectric element is slightly larger than the bottom layer.

6. The piezoelectric switch of claim 5 wherein said piezoelectric element is affixed to the inner surface of the closed top end by a pressure-sensitive adhesive.

7. The piezoelectric switch of claim 6 wherein the top layer of said piezoelectric element is affixed to the bottom layer of said piezoelectric element to form a one-piece, generally disc-shaped member.

8. The piezoelectric switch of claim 7 wherein said electrical conductor comprises a first conductive wire coupled to said printed circuit board and the top layer of said piezoelectric element and a second conductive wire coupled to said printed circuit board and the bottom layer of said piezoelectric element.

9. A piezoelectric switch comprising:

(a). a housing having an inner surface, an outer surface and a closed top end accessible to a tactile input;

(b). a piezoelectric element having a top layer made of piezo crystal and a bottom layer made of a conductive metal, said piezoelectric element being characterized by generating of an electrical signal upon deformation;

(c). a printed circuit board disposed within said housing; and (d). a flex circuit having a positive terminal, a negative terminal and a printed circuit board overlay portion, said flex circuit sandwiching said piezoelectric element therewithin so that the positive terminal contacts the top layer and the negative terminal contacts the bottom layer, the printed circuit board overlay portion being affixed to said printed circuit board, said flex circuit being disposed within said housing so that the positive terminal is affixed to the inner surface of the closed top end.

10. The piezoelectric switch of claim 9 further comprising a layer of potting compound disposed within said housing, said layer of potting compound being resiliently deformable so as to enable flexure of said piezoelectric element for generating the electrical signal.

11. The piezoelectric switch of claim 10 wherein the bottom layer of said piezoelectric element is made of brass.

12. The piezoelectric switch of claim 11 wherein the positive terminal of said flex circuit is affixed to the inner surface of the closed top end by a pressure-sensitive adhesive.

13. The piezoelectric switch of claim 12 wherein the top layer of said piezoelectric element is affixed to the bottom layer of said piezoelectric element to form a one-piece, generally disc-shaped member.

14. The piezoelectric switch of claim 13 wherein said potting compound is silicon.

15. A piezoelectric switch comprising:

(a). a housing having an inner surface, an outer surface and a central member which separates the interior of said housing into a top enclosure area and a bottom enclosure area, the central member having a flat top surface and a flat bottom surface;

(b). a pushbutton assembly slidably disposed within the top enclosure area of said housing, said pushbutton assembly being disposed so as to selectively apply an increased level of pressure onto the flat top surface of the central member in said housing;

(c). a piezoelectric element characterized by generating an electrical signal upon deformation, said piezoelectric element being disposed within the bottom enclosure area of said housing and coupled onto the flat bottom surface of the central member of said housing, wherein said piezoelectric element experiences deformation upon the application of the increased level of pressure onto the flat top surface of the central member in said housing by said pushbutton assembly;

(d). a printed circuit board disposed within said housing; and (e). an electrical conductor coupled to said piezoelectric element and said printed circuit board.

16. The piezoelectric switch of claim 15 further comprising a layer of potting compound disposed within the bottom enclosure area of said housing, said layer of potting compound being resiliently deformable so as to enable flexure of said piezoelectric element for generating the electrical signal.

17. The piezoelectric switch of claim 16 wherein said pushbutton assembly comprises a dome spring disposed on the flat top surface of said central member of said housing and a pushbutton disposed on the dome spring.

18. The piezoelectric switch of claim 17 wherein said potting compound is silicon.

19. A piezoelectric switch comprising:

(a). a housing having an inner surface, an outer surface and a closed top end accessible to a tactile input;

(b). a piezoelectric element having a top layer and a bottom layer, said piezoelectric element being characterized by generating an electrical signal upon deformation;

(c). a printed circuit board disposed within said housing; and (d). a flex circuit having a positive terminal, a negative terminal and a printed circuit board overlay portion, said flex circuit sandwiching said piezoelectric element therewithin so that the positive terminal contacts the top layer and the negative terminal contacts the bottom layer, the printed circuit board overlay portion being affixed to said printed circuit board, said flex circuit being disposed within said housing so that the positive terminal is coupled directly to the inner surface of the closed top end.

* * * * *